US010122329B2

(12) United States Patent
Hofheinz et al.

(10) Patent No.: US 10,122,329 B2
(45) Date of Patent: Nov. 6, 2018

(54) MATCHING CIRCUIT FOR LOW NOISE AMPLIFIER AND LOW NOISE AMPLIFIER COMPRISING SUCH A CIRCUIT

(71) Applicant: COMMISSARIAT A L'ENERGIE ATOMIQUE ET AUX ENERGIES ALTERNATIVES, Paris (FR)

(72) Inventors: Max Hofheinz, Grenoble (FR); Salha Jebari, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/699,376

(22) Filed: Sep. 8, 2017

(65) Prior Publication Data
US 2018/0076777 A1     Mar. 15, 2018

(30) Foreign Application Priority Data

Sep. 9, 2016  (FR) ..................................... 16 58429

(51) Int. Cl.
| | | |
|---|---|---|
| *H03F 3/191* | (2006.01) | |
| *H03F 1/56* | (2006.01) | |
| *H03F 3/19* | (2006.01) | |
| *H03F 19/00* | (2006.01) | |

(52) U.S. Cl.
CPC ............... *H03F 1/565* (2013.01); *H03F 3/19* (2013.01); *H03F 19/00* (2013.01); *H03F 2200/294* (2013.01); *H03F 2200/387* (2013.01)

(58) Field of Classification Search
CPC ..................................................... H03F 3/191

USPC .................................................. 330/302, 305
See application file for complete search history.

(56) References Cited

U.S. PATENT DOCUMENTS

| | | | | |
|---|---|---|---|---|
| 9,768,752 | B2* | 9/2017 | du Toit | .................... H03H 7/40 |
| 2004/0041634 | A1* | 3/2004 | Sugiura | .................. H03F 1/565 |
| | | | | 330/302 |
| 2007/0115064 | A1* | 5/2007 | Udomoto | ................ H03F 3/191 |
| | | | | 330/302 |
| 2014/0218105 | A1 | 8/2014 | Aoki et al. | |

FOREIGN PATENT DOCUMENTS

WO    WO 2012/123642 A1    9/2012

OTHER PUBLICATIONS

Search Report as issued in French Patent Application No. 1658429, dated May 11, 2017.

(Continued)

*Primary Examiner* — Henry Choe
(74) *Attorney, Agent, or Firm* — Pillsbury Winthrop Shaw Pittman LLP

(57) ABSTRACT

An impedance matching circuit be connected to a non-linear impedance including a superconductor, includes a first terminal designated first connection port to be connected to a first connector of the non-linear impedance, a second terminal designated second connection port to be connected to a second connector of the non-linear impedance, a third terminal designated input/output terminal to receive the signal to amplify and a fourth terminal designated supply terminal to be connected to a polarisation source and configured so that a voltage V is applied between the first connection port and the second connection port. The circuit further includes a plurality of passive electrical components.

15 Claims, 10 Drawing Sheets

(56) References Cited

OTHER PUBLICATIONS

Vesterinen, V., et al., "Tunable Impedance Matching for Josephson Junction Reflection Amplifier," IEEE Transactions on Applied Superconductivity, vol. 23, No. 3, Jun. 2013, 4 pages.

Vijay, R., et al., "Invited Review Article: The Josephson bifurcation amplifier," Review of Scientific Instruments, vol. 80, No. 11, Nov. 2009, pp. 111101-1-111101-17.

Taur, Y., et al., "Parametric amplification and oscillation at 36 GHz using a point-contact Josephson junction," Journal of Applied Physics, vol. 48, No. 3, Mar. 1977, pp. 1321-1326.

Lähteenmäki, P., et al., "Josephson junction microwave amplifier in self-organized noise compression mode," Scientific Reports, vol. 2, Feb. 2012, pp. 1-5.

\* cited by examiner

MATCHING CIRCUIT FOR LOW NOISE AMPLIFIER AND LOW NOISE AMPLIFIER COMPRISING SUCH A CIRCUIT

CROSS-REFERENCE TO RELATED APPLICATIONS

This application claims priority to French Patent Application No. 1658429, filed Sep. 9, 2016, the entire content of which is incorporated herein by reference in its entirety.

FIELD

The technical field of the invention is that of high frequency amplifiers. The present invention relates to a matching circuit for a low noise amplifier. The invention also relates to a low noise amplifier comprising such a matching circuit and in particular a low noise amplifier with Josephson junction.

BACKGROUND

Within the framework of fundamental research or radio astronomy, it is often necessary to resort to amplifiers designated very low noise amplifiers, that is to say amplifiers of which the noise is as close as possible to the theoretical limit imposed by quantum mechanics, and this is true for frequencies ranging from MHz to THz. It is possible to distinguish two types of amplifiers: phase preserving amplifiers and phase sensitive amplifiers. Phase sensitive amplifiers are not subject to the theoretical limitation but they are difficult to use because the phase of the signal to amplify must correspond perfectly to the amplified quadrature. Phase preserving amplifiers are subject to the quantum limit but on the other hand do not impose any condition regarding the phase of the signal to amplify.

In the field of high frequency and very high frequency amplification it is known to use amplification by reflection. The latter is obtained for example using a transmission line of impedance $Z_0$ terminated by an impedance $Z_L(f)$ where f is the frequency of the signal. The voltage reflection coefficient of such a structure is given by $$G(f) = \frac{(Z_L(f) - Z_0)}{(Z_L(f) + Z_0)}.$$

If it is managed to obtain a negative impedance $Z_L(f)$ of which the absolute value is close to $Z_0$, the reflection coefficient G(f) diverges and the reflected signal is thus amplified. Obviously, this condition is only met for a given frequency band which then corresponds to the pass band of the amplifier.

In the field of amplification, it is also known to use semiconductor transistors working at cryogenic temperatures. The transistors are voltage polarised which makes the use of this type of amplifier very easy to implement. On the other hand their noise level, even at cryogenic temperature, still remains high: of the order of 10 photons in the best of cases, i.e. 20 times the quantum limit. To limit noise to the maximum, it has been proposed to use a parametric amplifier in which the negative impedance is obtained for example through four Josephson junctions. The circuit of the amplifier has a first mode at the signal frequency $f_s$ and a second mode at the idler frequency $f_i$. The parameters of the circuit are modified using the pump of frequency $f_p$. This amplifier makes it possible to obtain a pass band of several MHz with a noise close to the quantum limit but requires the generation of a pump, which makes it complex to implement.

Another way of understanding this parametric amplification is to envisage the latter in terms of photons, each photon being associated with an energy. For example, a first photon of energy $E_1$ may be converted into a second photon of energy $E_2$ and a third photon of energy $E_3$ if the relation between these three energies is such that $E_1=E_2+E_3$ (this is a necessary condition but not sufficient). Knowing that it is possible to associate a frequency with each energy, this equality becomes $f_1=f_2+f_3$. If it is sought to amplify a signal of frequency $f_2$, it is thus possible to resort to a signal of frequency $f_1$ on condition that a mode, that is to say a resonance of the system, at a frequency $f_3$ is also present. Hereafter, the frequency $f_1$ is called pump frequency $f_p$, the frequency $f_2$ is called signal frequency $f_s$ and the frequency $f_3$ is called idler frequency $f_i$. It is possible to obtain an amplification of a signal of frequency $f_s$ by the generation of other signal photons of frequency $f_s$ from pump photons of frequency $f_p$, this generation also leading to the generation of idler photons of frequency $f_i$. In order that this amplification process takes place, it is moreover necessary, in addition to the condition of conservation of energy, that the different frequencies are coupled together. Such a coupling is achieved using a non-linear impedance.

Alternatively, it has been proposed to use an amplifier in which the negative impedance is obtained using a voltage polarised Josephson junction. This voltage polarisation makes it possible to dispense with the pump and contributes to the simplification of the device. Indeed, once the junction polarised, the Cooper pairs responsible for the superconductor current provided with an energy proportional to the voltage applied to the junction are going to have to relax, that is to say return to their fundamental energy state. Yet, the only mechanism enabling this relaxation leads to the emission of one or more photons of which the energy is linked to the applied polarisation voltage. In other words, the applied voltage makes it possible to generate photons in the same way as the pump frequency of the parametric amplifier, the frequency of these photons here being a function of the voltage applied to the junction.

In addition, amplification may be obtained, in the simplest embodiment, with a single Josephson junction. Such a device is illustrated in FIG. 1 and is composed of a matching circuit comprising a first connection port J1 and a second connection port J2, these two ports being connected to a Josephson junction JJ. In order to polarise the Josephson junction JJ, a voltage source V is connected using a T connection constituted of the inductance $L_3$ and the capacitance $C_2$. The matching circuit also comprises a resistance $R_1$ in series with a capacitance $C_1$ and an inductance $L_1$ in parallel with each other. This matching circuit enables a polarisation of the Josephson junction JJ such that the latter has a negative differential impedance over a wide voltage range while maintaining a positive global impedance, that is to say the impedance of the Josephson junction JJ and the matching circuit.

In this device, it is possible to distinguish two situations. For high and low frequencies, the Josephson junction is short-circuited by the matching circuit. The real part of the reflection coefficient is then equal to $$\mathrm{Re}(G(f)) = \frac{(R_1 - Z_0)}{(R_1 + Z_0)}$$

with $R_1$ the resistance of the matching circuit. $R_1$ being of the order of several ohms compared to several tens of ohms for $Z_0$, the real part of the reflection coefficient becomes $Re(G(f)) \sim -1$ and there is thus no amplification of the signal but only a dephasing of $\pi$. On the other hand, at the frequency of the signal $f_s$, the impedance of the matching circuit is high and the impedance of the Josephson junction JJ thus becomes "visible" such that the impedance measured at the level of the input/output port is such that $Z_L < 0$ and $|Z_L| \geq Z_0$, the amplitude of the reflection is thus $Re(G(f_s)) > 1$ and there is thus amplification of the signal. Moreover, the more $Z_L$ approaches $-Z_0$, the greater the amplification. In the circuit evoked previously, the circuit $L_2C_2$ makes it possible to achieve impedance matching between the impedance of the Josephson junction JJ at the frequency $f_s$ and the input port of the circuit. The inductance $L_3$ makes it possible for its part to isolate the high frequency part of the circuit from the DC part. However, although this device improves the noise compared to an amplifier using transistors, the noise level remains higher than the noise level obtained with a parametric amplifier.

There thus exists a need to manufacture an amplifier making it possible to maintain the noise level similar to that of a parametric amplifier while having the simplicity of an amplifier with voltage polarised Josephson junction.

SUMMARY

Aspects of the invention offer a solution to the aforementioned problems by proposing a matching circuit making it possible to reduce the noise generated by an amplifier with voltage polarised Josephson junction. It also proposes an amplifier using such a circuit.

A first aspect of the invention relates to an impedance matching circuit intended to be connected to a non-linear impedance comprising a superconductor, the circuit comprising a first terminal designated first connection port intended to be connected to a first connector of the non-linear impedance, a second terminal designated second connection port intended to be connected to a second connector of the non-linear impedance, a third terminal designated input/output terminal intended to receive the signal to amplify with a gain in power G and a pass band BW and a fourth terminal designated supply terminal intended to be connected to a polarisation source and configured so that a voltage V can be applied between the first connection port and the second connection port.

The matching circuit according to an embodiment of the invention comprises a plurality of passive electrical components configured such that the impedance $Z(f)$ between the first connection port and the second connection port for a signal of frequency f has a real part $Re(Z(f))$ such that:

$Re(Z(f_s)) > 0$ with $f_s$ a first frequency designated signal frequency;

$Re(Z(f_i)) > 0$ with $f_i$ a second frequency designated idler frequency;

$$Re(Z(0)) < \frac{h}{4e^2} \frac{f_p}{G \cdot BW}$$

with $f_p$ a third frequency designated pump frequency;

$$Re(Z(f_p + f_s)) < \frac{f_p + f_s}{f_i} Re(Z(f_i));$$

the pump frequency being chosen such that $nf_p = f_s + f_i$ with n an integer belonging to $[1, +\infty]$ and the idler frequency being chosen such that $$f_i > \frac{k_B T}{h}$$

with T the temperature of the circuit, $k_B$ Boltzmann's constant and h Planck's constant.

$Z(f_x)$ is taken to mean the value of the impedance for a frequency belonging to a range of frequencies of defined width and centred on the frequency $f_x$. Unless stated otherwise, when reference is made to a frequency $f_x$ the latter must be understood as a frequency f belonging to an interval $[f_x - \Delta f, f_x + \Delta f]$ with $\Delta f < 0.5 f_s$ or even $\Delta f < 0.1 f_s$. The polarisation source may notably be chosen from a voltage source, a current source or instead a finite impedance.

Generally speaking, the probability that a Cooper pair has of relaxing while generating a photon at the frequency f is approximately proportional to the impedance seen by the superconductor element at this frequency f. In particular, a Cooper pair has a greater probability of relaxing while emitting a photon at the frequency f when a resonance mode of the impedance $Z(f)$ seen by the non-linear impedance is present at this frequency. The inventors, benefiting from this property, have identified the conditions concerning this impedance that limit the noise generated.

The conditions $Re(Z(f_s)) > 0$ and $Re(Z(f_i)) > 0$ make it possible to ensure the amplification of the signal at the signal frequency $f_s$. Indeed the impedance being non zero at these frequencies, photons may be generated at these frequencies.

The condition $$Re(Z(0)) < \frac{h}{4e^2} \frac{f_p}{G \cdot BW}$$

for its part makes it possible to stabilise the operating point. In addition, the condition Re $$(Z(f_p + f_s)) < \frac{f_p + f_s}{f_i} Re(Z(f_i))$$

makes it possible to avoid photons at the signal frequency $f_s$ being converted, during the relaxation of Cooper pairs, into photons at the pump frequency plus the signal frequency $f_p + f_s$, which would lead to the reduction of the signal to noise ratio, a part of the photons of the signal being lost during this conversion. Indeed, it is also possible that photons of the signal of signal frequency $f_s$ associate with photons of the pump of pump frequency $f_p$ to create photons of pump frequency plus signal frequency $f_p + f_s$. The aforementioned condition makes it possible to ensure that the probability of such a process is low compared to the process giving rise to the amplification of the signal. It will be noted that this condition does not apply here at the signal frequency $f_p - f_s$. Thus, the signal frequencies $f_p + f_s$ and $f_p - f_s$ are treated differently, unlike what is done in the prior art.

Moreover, the condition $$f_i > \frac{k_B T}{h}$$

makes it possible to ensure that the idler frequency $f_i$ is not populated with thermal photons. The temperature referred to here is the temperature of the element in which the photons of the idler frequency $f_i$ dissipate, in general the electronic temperature of the element. Indeed, in the same way as the amplifier amplifies the signal of signal frequency $f_s$ by producing idler photons, the symmetrical process is also possible. The signal associated with thermal photons could thus be amplified leading to the generation of signal photons and thus the generation of noise at the signal frequency $f_s$. The aforementioned condition makes it possible to limit the noise coming from thermal photons at the idler frequency $f_i$.

Finally, the condition $nf_p=f_s+f_i$ makes it possible to ensure that the aforementioned condition concerning the conservation of energy is met.

In other words, thanks to the matching circuit according to an embodiment of the invention, unnecessary noise is not brought back from high frequencies to the amplification frequency. In addition, the useful signal is not lost to other frequencies.

Apart from the characteristics that have been mentioned in the preceding paragraph, the impedance matching circuit according to a first aspect of the invention may have one or more additional characteristics among the following, considered individually or according to all technically possible combinations thereof.

Beneficially, $$Re(Z(f_p+f_s)) < \frac{Re(Z(f_i))}{10}.$$

Thus, the conversion of photons at the signal frequency $f_s$ into photons at the pump frequency plus the signal frequency $f_p+f_s$ is still further reduced.

Beneficially, $$Re(Z(0)) < \frac{h}{4e^2}\frac{1}{10G}$$

which further improves the stability of the operating point.

Beneficially, $$Re(Z(f_p)) < \frac{4e^2}{h}BW\frac{f_p}{f_s\cdot f_i}Re(Z(f_s))Re(Z(f_i)).$$

Thus the probability of generating, from Cooper pairs, a photon at the pump frequency $f_p$ is less than the probability of generating from Copper pairs a photon at the signal frequency $f_s$ and a photon at the idler frequency $f_i$. In other words, the energy of the Cooper pairs is in an embodiment evacuated by the emission of photons of frequency $f_s$ and $f_i$, which makes it possible to ensure an optimal conversion of the Cooper pairs into photons at the signal frequency $f_s$ (and $f_i$) rather than at the pump frequency $f_p$.

Beneficially, the input/output terminal is intended to be connected to an impedance of value $Z_0$ and $$Re(Z(f_s)) < 2\frac{|Z_{trans}(f_s)|^2}{Z_0} \text{ with } Z_{trans}(f_s)$$

the voltage measured at the level of the input/output terminal when a unit current of frequency $f_s$ is applied between the first connection port and the second connection port (in other words when an alternating unit current of frequency $f_s$ flows between the first connection port and the second connection port). In an even more beneficial manner $$Re(Z(f_s)) < 1.1\frac{|Z_{trans}(f_s)|^2}{Z_0}.$$

This condition makes it possible to ensure that the photons amplified and to amplify are not dissipated in the circuit but instead sent to the input/output terminal.

Beneficially, $$Re(Z(f_p+f_i)) < \frac{f_p+f_i}{f_s}Re(Z(f_s)).$$

Even more beneficially, $$Re(Z(f_p+f_i)) < \frac{Re(Z(s_s))}{10}.$$

This condition makes it possible to ensure that photons at the idler frequency $f_i$ are not converted, in association with photons at the pump frequency $f_p$, into photons of pump frequency plus idler frequency $f_p+f_i$, which would have the consequence of reducing the amplification, the pump photons brought into play in this process not being able to serve in the amplification of the signal.

Beneficially, $$f_i > 4\frac{k_BT}{h}.$$

Since photons obey the Bose-Einstein distribution, this condition makes it possible to ensure that practically no thermal photon is found at the idler frequency $f_i$ in the element dissipating the photons at the idler frequency $f_i$.

Beneficially, n=1 or, in other words, $$f_p = \frac{2eV}{h} = f_s + f_i.$$

Thus, the generation of a signal photon only requires a single Cooper pair which makes the process more probable and thus the amplification more efficient.

Beneficially, max{Re(Z($f_s$)), $$Re(Z(f_i))\} < \frac{h}{4e^2}$$

or even max{Re(Z($f_s$)), Re(Z($f_i$))}<100Ω or even max{Re(Z($f_s$)), Re(Z($f_i$))}<10Ω. This condition makes it possible to improve the dynamic of the amplifier in which the matching circuit is intended to be used.

Beneficially, the impedance Z(f) has a local maximum in $f_s$ and/or $f_i$. Thus, the matching circuit has resonance modes at the signal frequency $f_s$ and/or at the idler frequency $f_i$ which makes it possible to guarantee that at these frequencies a photon has a high probability of being generated during relaxation of the Cooper pairs.

Beneficially, $$\frac{Re(Z(f_s)) \cdot Re(Z(f_i))}{f_s \cdot f_i} > \frac{Re(Z(f)) \cdot Re(Z(f - f_p))}{f \cdot (f_p - f)}$$

for any frequency f different to 0, $f_s$, $f_i$ and $f_p$. This condition makes it possible to ensure that the amplification amplifies only within the pass band, that is to say that the amplifier using a matching circuit according to an embodiment of the invention may have a high gain at $f_s$ without becoming unstable at other frequencies f.

Beneficially, the impedance $Z(f)$ has a local minimum in $f_p$ and/or $f_p+f_i$ and/or $f_p+f_s$. Thus, the circuit has anti-resonances at the pump frequency $f_p$, at the pump frequency plus the idler frequency $f_p+f_i$ and at the pump frequency plus the signal frequency $f_p+f_s$ which makes it possible to guarantee that at these frequencies a photon has a low probability of being generated during relaxation of the Cooper pairs.

Beneficially, the plurality of passive electrical components comprises:
- a first waveguide segment of which a first end is connected to the supply terminal through an inductance and to the input/output terminal through a first capacitance and a second end is connected to the first connection port;
- a second waveguide segment of which a first end is connected to earth through a second capacitance and a second end is connected to the first connection port;
- a third waveguide segment of which a first end is connected to an infinite impedance and a second end is connected to the first connection port;

Moreover, the second connection port is connected to earth. Thus, the electrical properties are obtained using waveguides. The impedance and the resonance frequency of the latter being easy to control through their dimensions, their use is very beneficial.

Beneficially, in an embodiment, the plurality of passive electrical components comprises:
- a first waveguide segment of which a first end is connected to the input/output terminal;
- a second waveguide segment of which a first end is connected to a second end of the first waveguide segment and of which a second end is connected to an infinite impedance;
- a third waveguide segment of which a first end is connected to the second end of the first waveguide segment and of which a second end is connected to an infinite impedance;
- a fourth waveguide segment of which a first end is connected to earth through a capacitance and to the supply terminal and of which a second end is connected to the first connection port;
- a fifth waveguide segment of which a first end is connected to an infinite impedance and of which a second end is connected to the first connection port.

Moreover, the second connection port is connected to earth, the second waveguide segment is moreover coupled in a capacitive manner to the fourth waveguide segment and the third waveguide segment is coupled in a capacitive manner to the fifth waveguide segment so as to form a coupler.

Beneficially, the plurality of passive electrical components comprises:
- an inductance $L_1$ of which a first connector is connected to the supply terminal and of which a second connector is connected to earth through a first capacitance, to the input/output terminal through a fourth capacitance and to the first connection port;
- a first waveguide segment of which a first end is connected to an infinite impedance and of which a second end is connected to earth through a resistance;
- a second waveguide segment of which a first end is at an infinite impedance and of which a second end is connected to the second connection port through a second capacitance;
- a third waveguide segment of which one end is connected to an infinite impedance and of which a second end is connected to the second connection port through a third capacitance;
- a fourth waveguide segment of which a first end is connected to earth and of which a second end is connected to the second connection port.

Moreover, the first waveguide segment is coupled in a capacitive manner to the fourth waveguide.

Beneficially, at least one waveguide segment is made out of a superconductor material in order to reduce dissipation, and thus thermal noise, within the matching circuit.

A second aspect of the invention relates to a reflection amplifier comprising an impedance matching circuit according to a first aspect of the invention, a polarisation source connected to the supply terminal, a non-linear impedance comprising a superconductor, the non-linear impedance comprising a first connector and a second connector, the first connector of the impedance being connected to the first connection port of the matching circuit, the second connector of the impedance being connected to the second connection port of the matching circuit. In addition, the voltage V applied between the first connection terminal and the second connection terminal by means of the polarisation source is chosen such that $$f_p = \frac{2eV}{h}$$

with 2e the electric charge of a Cooper pair and h Planck's constant.

Beneficially, in the amplifier according to a second aspect of the invention, the superconductor material of the non-linear impedance is chosen such that $$f_s < \frac{2\Delta}{h}$$

with $\Delta$ the superconductor gap of the superconductor. Thus, by imposing $$f_s < \frac{2\Delta}{h},$$

it is ensured that the dissipation of the superconductor is low at $f_s$.

Beneficially, $$f_p < \frac{4\Delta}{h},$$

and is so in order to ensure that the voltage applied to the non-linear impedance in order to make the Cooper pairs circulate through the non-linear impedance does not exceed the superconductor gap $2\Delta$ and that thus the transport does not involve quasi-particles at the level of the superconductor.

Moreover, this second aspect of the invention makes it possible to obtain performances similar to or equivalent to that of a parametric amplifier, but with a DC supply instead of a supply by a microwave signal. This makes the use of such an amplifier much simpler and cheaper, especially in a cryogenic environment. Such a benefit notably becomes important above 10 GHz.

In addition, the fact of working with a voltage polarised junction makes it possible to work at higher frequency. Indeed, in the case of a parametric amplifier, the junction is in the superconducting state where it has an inductive behaviour. This inductance, together with the capacitance of the junction, determines the plasma frequency of the junction has a value equal to around $$\frac{\Delta}{2h},$$

i.e. of the order of 30 GHz for aluminium (Al), 300 GHz for niobium nitride (NbN) and the frequency of the microwave signal used (and thus the working frequency of the amplifier) is limited by this plasma frequency. In the case of an amplifier according to the invention, the voltage polarised junction does not have an inductance and this amplifier may thus work up to frequencies of $$\frac{\Delta}{2h}$$

i.e. around 100 GHz for aluminium and 1 THz for niobium nitride. For a same material it will thus be possible to optimise an amplifier according to the invention for working frequencies around 3 times higher than those accessible with a conventional parametric amplifier based on Josephson junctions in the superconducting state.

Furthermore, as has been described previously, it is preferable to have an idler frequency $f_i$ such that $$f_i > \frac{k_B T}{h}$$

(or even $$f_i > 4 \frac{k_B T}{h})$$

in order to limit to the maximum the thermal noise of the amplifier. The facility of increasing the supply voltage makes it possible to increase easily the idler frequency $f_i$ which makes the cooling requirements less restrictive. An amplifier according to an embodiment of the invention operating at 4K (that is to say close to the temperature of liquid helium) with an idler frequency $f_i$ at 1 THz may thus be very close to the quantum limit even if the signal frequency $f_s$ is much lower. A typical parametric amplifier should on the other hand be cooled to temperatures below 100 mK, which requires a dilution refrigerator.

Finally, the gain of the amplifier according to the invention increases with the critical current of the junction (or of the SQUID), whereas in the case of parametric amplifiers it decreases. This can facilitate the optimisation of the amplifier to have both a high gain for a wide pass band and a wide dynamic range (high compression point) which requires high critical currents.

Apart from the characteristics that have been mentioned in the preceding paragraph, the reflection amplifier according to a second aspect of the invention may have one or more additional characteristics among the following, considered individually or according to all technically possible combinations thereof.

Beneficially, the non-linear impedance comprises a Josephson junction. The Josephson junction notably has the benefit of being a non-linear element with physical characteristics and a behaviour that are well understood and thus simpler to implement.

Beneficially, the Josephson junction is of SIS (Superconductor/Insulator/Superconductor) type. A SIS type junction has the benefit of being a non-dissipating non-linear element, which avoids creating parasitic conversion processes.

Beneficially, the superconducting non-linear impedance comprises a SQUID. Thus, it is possible to modulate the gain of the amplifier using a magnetic field.

Beneficially, the pass band BW of the amplifier is chosen such that $$BW > \frac{2e}{h} \Delta V$$

with $\Delta V$ the voltage noise integrated from 0 to the lower limit of the pass band. This notably makes it possible to reduce the impact of polarisation fluctuations on the noise of the amplifier.

The invention and its different applications will be better understood on reading the description that follows and by examining the figures that accompany it.

BRIEF DESCRIPTION OF THE FIGURES

The figures are presented for indicative purposes and in no way limit the invention.

DETAILED DESCRIPTION

Unless stated otherwise, a same element appearing in the different figures has a single reference. All the following embodiments have been conceived in the case where the input/output terminal ES is intended to be connected or is connected to an impedance line $Z_0$ equal to 50Ω.

Figure 1:
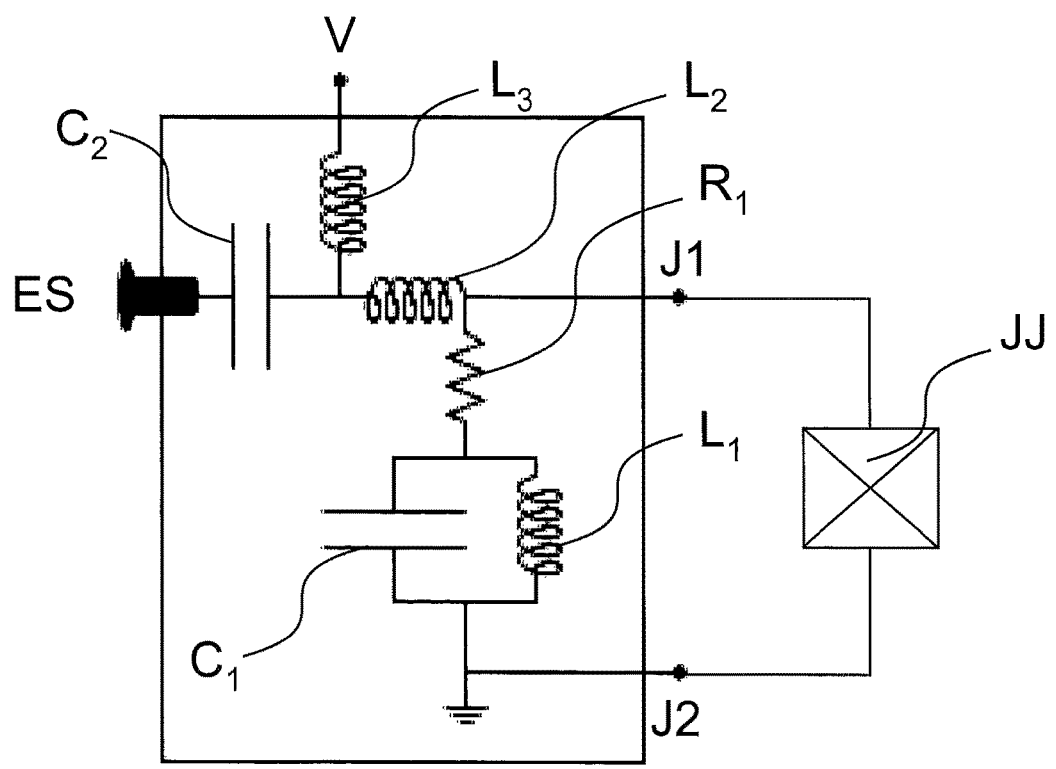
FIG. 1 shows an amplifier with Josephson junction according to the prior art.
Figure 2:
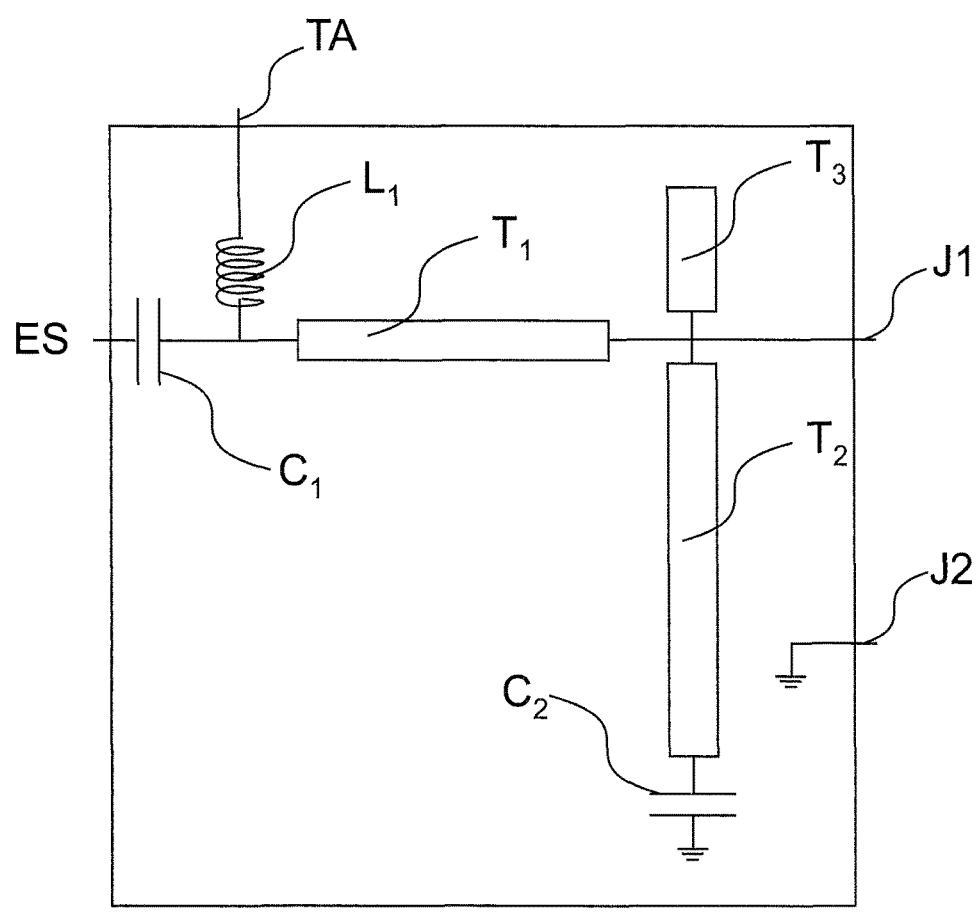
FIG. 2 shows a matching circuit according to a first embodiment of a first aspect of the invention.

A matching circuit intended to be connected to a non-linear impedance L comprising a superconductor according to a first embodiment of a first aspect of the invention is illustrated in FIG. 2. The matching circuit comprises a first terminal designated first connection port J1 intended to be connected to a first connector B1 of the non-linear impedance L, a second terminal designated second connection port J2 intended to be connected to a second connector B2 of the non-linear impedance L, a third terminal designated input/output terminal ES intended to receive the signal to amplify, the amplification taking place with a gain in power G and over a pass band BW, and a fourth terminal designated supply terminal TA intended to be connected to a polarisation source ST and configured so that a voltage V is applied between the first connection port J1 and the second connection port J2.

The matching circuit also comprises a plurality of passive electrical components ($T_1$, $T_2$, $T_3$, $C_1$, $C_2$, $L_1$) configured such that the impedance $Z(f)$ between the first connection port J1 and the second connection port J2 for a signal of frequency f has a real part $Re(Z(f))$ such that:

$Re(Z(f_s))>0$ with $f_s$ a first frequency designated signal frequency;

$Re(Z(f_i))>0$ with $f_i$ a second frequency designated idler frequency;

$$Re(Z(0)) < \frac{h}{4e^2} \frac{f_p}{G \cdot BW}$$

with $f_p$ a third frequency designated pump frequency;

$$-Re(Z(f_p + f_s)) < \frac{f_p + f_s}{f_i} Re(Z(f_i)).$$

Moreover, the pump frequency is chosen such that $nf_p=f_s+f_i$ with n an integer belonging to $[1, +\infty]$ and the idler frequency is chosen such that $$f_i > \frac{k_B T}{h}$$

with T the temperature of the circuit, $k_B$ Boltzmann's constant and h Planck's constant. As has been specified beforehand, the signal frequencies $f_p+f_s$ and $f_p-f_s$ are here treated differently. This difference is explained by the fact that the inventors use a quantum interpretation that gives a very different sense to the bands $f_p+f_s$ and $f_p-f_s$:

the band $f_p-f_s$ is due to a process where each Cooper pair that tunnels through the junction gives one photon at the frequency $f_s$ and one photon at the frequency $f_p-f_s$ which amplifies the signal at the frequency $f_s$ (stimulated emission effect) and gives rise to a noise with a half-photon $hf_s$ (spontaneous emission effect) added;

the band $f_p+f_s$ is due to a process where each Cooper pair is frequency shifted from the frequency $f_s$ to the frequency $f_p+f_s$ by absorbing the energy of a Cooper pair that tunnels, which leads to the absorption of the signal at the frequency $f_s$ without adding noise.

If the two processes have the same intensity, the process associated with the frequency $f_p+f_s$ results in the loss of half of the incident signal and only the other half may be amplified, which is equivalent to reducing the gain in power twofold. In addition, the noise is increased twofold to pass from a half-photon hf/2 to a photon hf. Thus, if the band $f_p+f_s$ may be greatly reduced by minimising the impedance at the frequency $f_p+f_s$ as the invention proposes, it is possible to tend towards the optimal noise.

In the embodiment illustrated in FIG. 2, a part of the passive electrical elements is realised using waveguide segments (or CPW for CoPlanar Waveguide). The latter may be made from a superconductor material in order to minimise losses by Joule effect and thus thermal noise at the level of the circuit. As a reminder, a CPW of impedance $Z_0$ and of length l terminating by an impedance $Z_L$ has an impedance $Z_{in}$ measured at the input of the CPW given by $$Z_{in} = \frac{Z_L + jZ_0\tan(\beta l)}{Z_0 + jZ_L\tan(\beta l)} Z_0$$

where β is the propagation constant. The impedance of the waveguide segments is thus easy to control through their dimensions which makes their use very beneficial. However, it is also possible to use passive electrical elements such as capacitances or inductances, for example when the dimensional requirements are not compatible with the use of waveguide segments.

More particularly, the matching circuit illustrated in FIG. 2 comprises a first waveguide segment $T_1$ of which a first end is connected to the supply terminal TA through an inductance $L_1$ and to the input/output terminal ES through a first capacitance $C_1$ and a second end is connected to the first connection port J1. As will be seen hereafter, this first waveguide segment $T_1$ makes it possible to transform the impedance so as to favour a wide frequency band or an optimal noise as a function of the envisaged applications.

The circuit also comprises a second waveguide segment $T_2$ of which a first end is connected to earth through a second capacitance $C_2$ and a second end is connected to the first connection port J1. The second capacitance is chosen so as to behave in short-circuit at the frequencies $f_i$, $f_s$ and $f_p$.

In addition, the circuit comprises a third waveguide segment $T_3$ of which a first end is connected to an infinite impedance (that is to say an open circuit) and of which a second end is connected to the first connection port J1. Finally, the second connection port J2 is connected to earth.

In a first exemplary embodiment, $f_p$=12 GHz and $f_s$=$f_i$=6 GHz are chosen. The first waveguide segment $T_1$ has a length $$l = \frac{\lambda_s}{4},$$

with $\lambda_s$ the wavelength associated with the frequency $f_s$ and an impedance $Z_1$ equal to 50Ω. The second waveguide segment $T_2$ has a length $$l = \frac{\lambda_p}{2},$$

with $\lambda_p$ the wavelength associated with the frequency $f_p$ and an impedance $Z_2$ equal to 150Ω. This CPW thus makes it possible to produce antiresonances of the impedance between the first connection port J1 and the second connection port J2 at the frequencies k×$f_p$ with k∈[1, +∞] and has a frequency close to the zero frequency, but makes it possible to apply a DC voltage at the level of the connection port J1. In other words, the real part of the impedance Re(Z(f)) is zero at these frequencies. The third waveguide segment $T_3$ has a length $$l = \frac{\lambda_{p+s}}{4},$$

with $\lambda_{p+s}$ the wavelength associated with the frequency $f_p$+$f_s$, and an impedance $Z_3$ equal to 150Ω. This CPW thus makes it possible to produce antiresonances at the frequencies k'×($f_p$+$f_s$) with k' an uneven number and k'∈[1, +∞]. Indeed, when the frequency is equal to k'×($f_p$+$f_s$) with k' an uneven number and k'∈[1, +∞], the impedance measured at the level of the first connection port J1 is equal to $$\frac{Z_3^2}{Z_L},$$

$Z_L$ being the terminal impedance of the waveguide segment. Yet, in the case of the third waveguide segment $T_3$, $Z_L$=+∞ and thus the impedance measured at the level of the first connection port J1 is zero.

Figure 3:
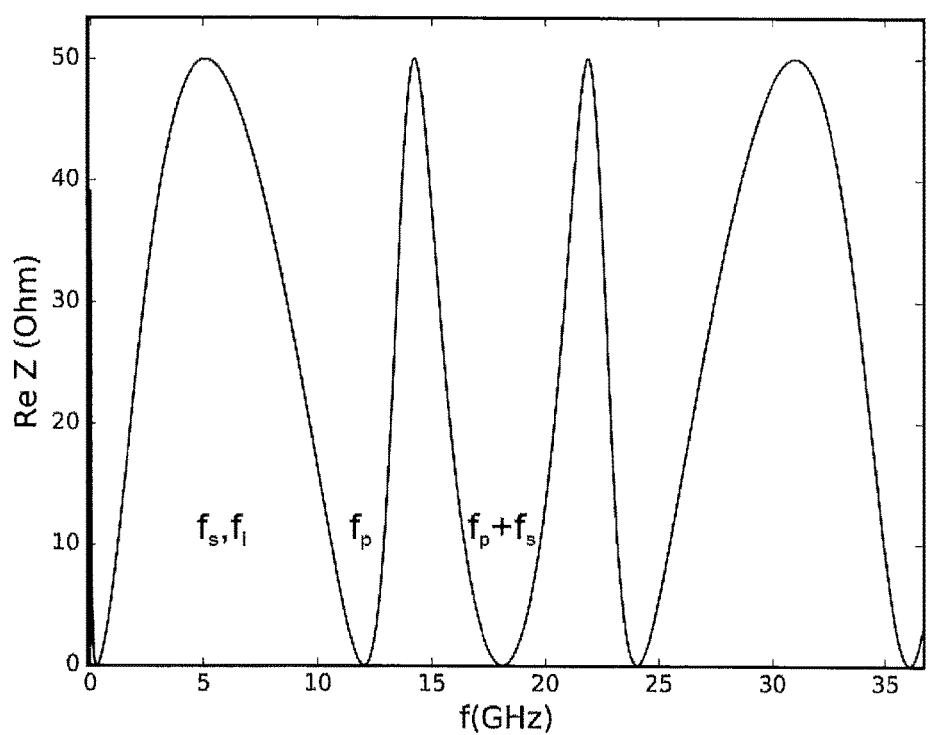
FIG. 3 shows a graph presenting the real part of the impedance as a function of the frequency of a matching circuit according to a first embodiment of a first aspect of the invention.

The real part of the impedance as a function of the frequency of this particular embodiment is illustrated in FIG. 3. The impedance is zero for the pump $f_p$, signal plus pump $f_s$+$f_p$, idler plus pump $f_p$+$f_i$ frequencies as well as the first harmonic of the pump frequency 2$f_p$. Moreover, the impedance indeed has a high impedance (thus non zero) at the frequencies $f_s$ and $f_i$. More particularly, the measured impedance has a local maximum at the frequencies $f_s$ and $f_i$. The structure of FIG. 2 thus meets all the aforementioned conditions.

Figure 4:
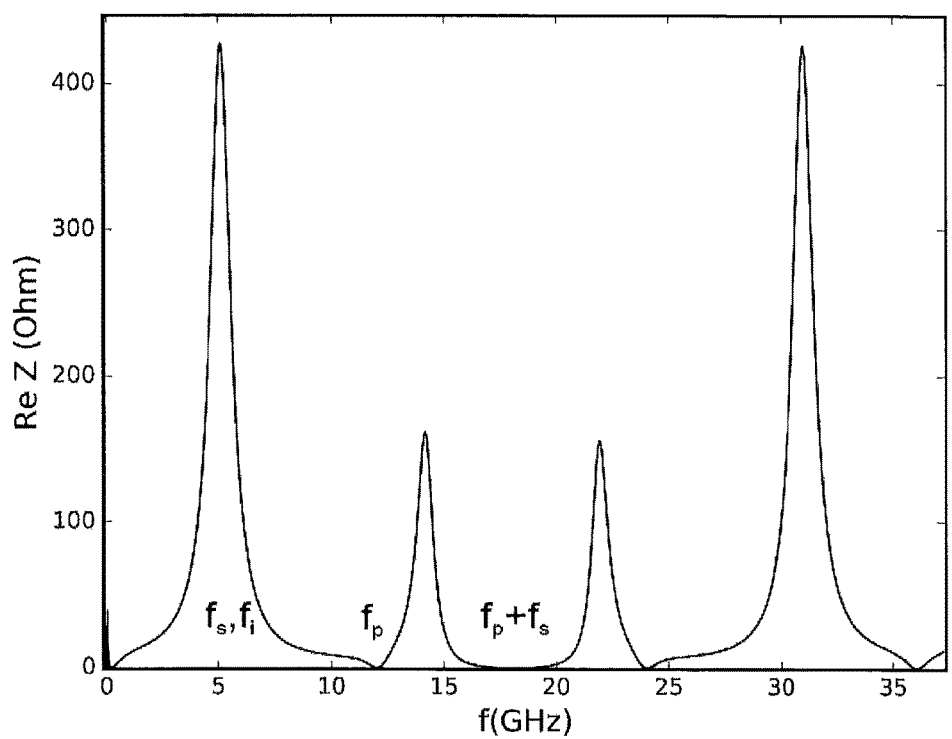
FIG. 4 shows a graph presenting the real part of the impedance as a function of the frequency of a matching circuit according to a first alternative of a first embodiment of a first aspect of the invention.

In an alternative of this first exemplary embodiment, the impedance $Z_1$ of the first waveguide $T_1$ is chosen equal to 150Ω. The real part of the impedance as a function of the frequency of this exemplary embodiment is illustrated in FIG. 4. It may be noted that if resonances appear at the same frequencies as previously, the peaks associated with these resonances are higher and narrower. In other words, it is possible to modify the gain and the pass band of an amplifier comprising such a circuit by modifying the value of the impedance $Z_1$ of the first waveguide $T_1$. In the first exemplary embodiment, the value of this impedance makes it possible to obtain a wide pass band around the signal frequency $f_s$ with nevertheless a narrow minimum at the frequency $f_p$+$f_s$ and thus a narrower range of frequencies where the noise is optimal. In the alternative of this first exemplary embodiment, the pass band around the signal frequency $f_s$ is reduced but makes it possible to obtain a wider minimum at the frequency $f_p$+$f_s$ and thus a wider range of frequencies where the noise is optimal.

Figure 5:
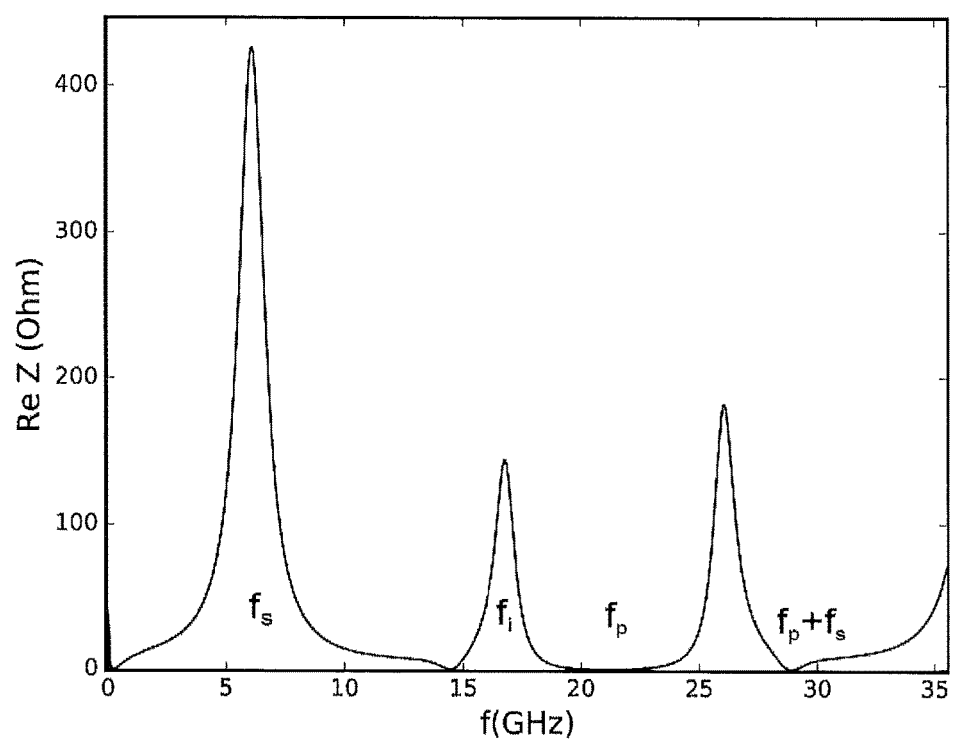
FIG. 5 shows a graph presenting the real part of the impedance as a function of the frequency of a matching circuit according to a second alternative of a first embodiment of a first aspect of the invention.

In a third exemplary embodiment, $f_s$=6 GHz, $f_i$=16.8 GHz and $f_p$=22.8 GHz are chosen. In this third exemplary embodiment, the first waveguide segment $T_1$ has a length $$l = \frac{\lambda_1}{4},$$

with $\lambda_1$ the wavelength associated with the frequency $f_1$=7.25 GHz and an impedance $Z_1$ equal to 150Ω. The second waveguide segment $T_2$ has a length $$l = \frac{\lambda_2}{2},$$

with $\lambda_2$ the wavelength associated with the frequency $f_2$=14.5 GHz and an impedance $Z_2$ equal to 150Ω. The third waveguide segment $T_3$ has a length $$l = \frac{\lambda_3}{4},$$

with $\lambda_3$ the wavelength associated with the frequency $f_3$=21.5 GHz and an impedance $Z_2$ equal to 150Ω. The real part of the impedance as a function of the frequency of this particular embodiment is illustrated in FIG. 5. In this exemplary embodiment, it is clearly apparent that the frequency of the signal to amplify $f_s$ may be different from the idler frequency $f_i$ and beneficially lower than the idler frequency.

Figure 6:
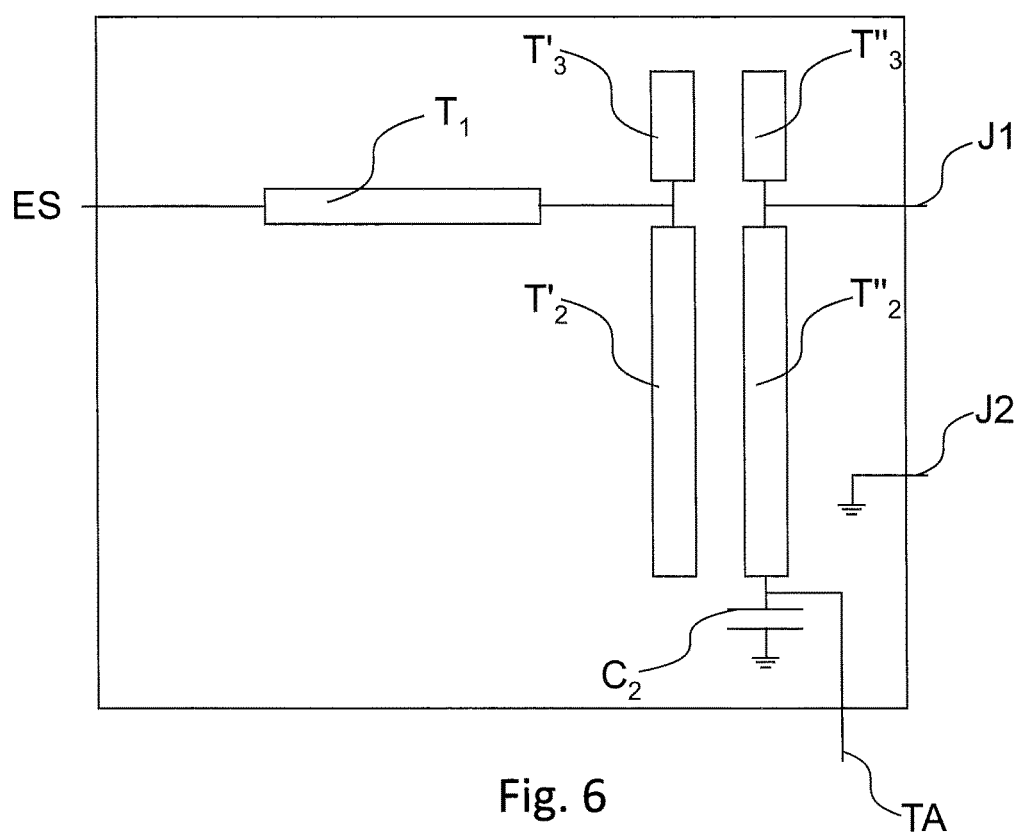
FIG. 6 shows a matching circuit according to a second embodiment of a first aspect of the invention.

To optimise both the pass band BW at the signal frequency $f_s$ and the width of the range of frequencies where the noise is optimal, a second embodiment of a first aspect of the invention is illustrated in FIG. 6.

In this embodiment, the matching circuit comprises a first waveguide segment $T_1$ of which a first end is connected at the terminal to the input/output terminal ES and a second end is connected to a first end of a second waveguide T'$_2$ and to a first end of a third waveguide T'$_3$. The second ends of the second waveguide T'$_2$ and third waveguide T'$_3$ are for their part each connected to an infinite impedance (that is to say an open circuit). The second waveguide segment T'$_2$ is moreover coupled in a capacitive manner to a fourth waveguide T"$_2$ and the third waveguide segment T'$_3$ is moreover coupled in a capacitive manner to a fifth waveguide T"$_3$ so as to form a coupler. A first end of the fourth waveguide T"$_2$ is connected to earth through a capacitance $C_2$ and to the supply terminal TA. A second end of the fourth waveguide T"$_2$ is connected to the first connection port J1. A first end of the fifth waveguide T"$_3$ is connected to an infinite impedance (that is to say an open circuit). A second end of the fifth waveguide T"$_3$ is connected to the first connection port J1. The second connection port J2 is for its part connected to earth.

Unlike the first aforementioned embodiment, the first waveguide segment $T_1$ makes it possible to transform the impedance so as to favour a wide frequency band without compromising the optimal noise.

In an exemplary embodiment, $f_p=12$ GHz and $f_s=f_i=6$ GHz are chosen. In this exemplary embodiment, the first waveguide segment T1 has a length $$l = \frac{\lambda_s}{3.28}$$

with $\lambda_s$ the wavelength associated with the signal frequency $f_s$ and an impedance $Z_1$ equal to 42.5Ω. The second waveguide segment $T'_2$ and the fourth waveguide segment $T''_2$ have a length $$l = \frac{\lambda_p}{3}$$

with $\lambda_p$ the wavelength associated with the frequency $f_p$ and an even impedance $Z_{2P}$ equal to 90Ω and an uneven impedance $Z_{2I}$ equal to 9Ω (these two impedances are due to coupling between the second waveguide segment $T'_2$ and the fourth waveguide segment $T''_2$). Moreover, the third waveguide segment $T'_3$ and the fifth waveguide segment $T''_3$ have a length $$l = \frac{\lambda_p}{6}$$

with $\lambda_p$ the wavelength associated with the frequency $f_p$ and an even impedance $Z_{3P}$ equal to 90Ω and an uneven impedance $Z_{3I}$ equal to 9Ω (these two impedances are due to coupling between the third waveguide segment and the fifth waveguide segment).

Figure 7:
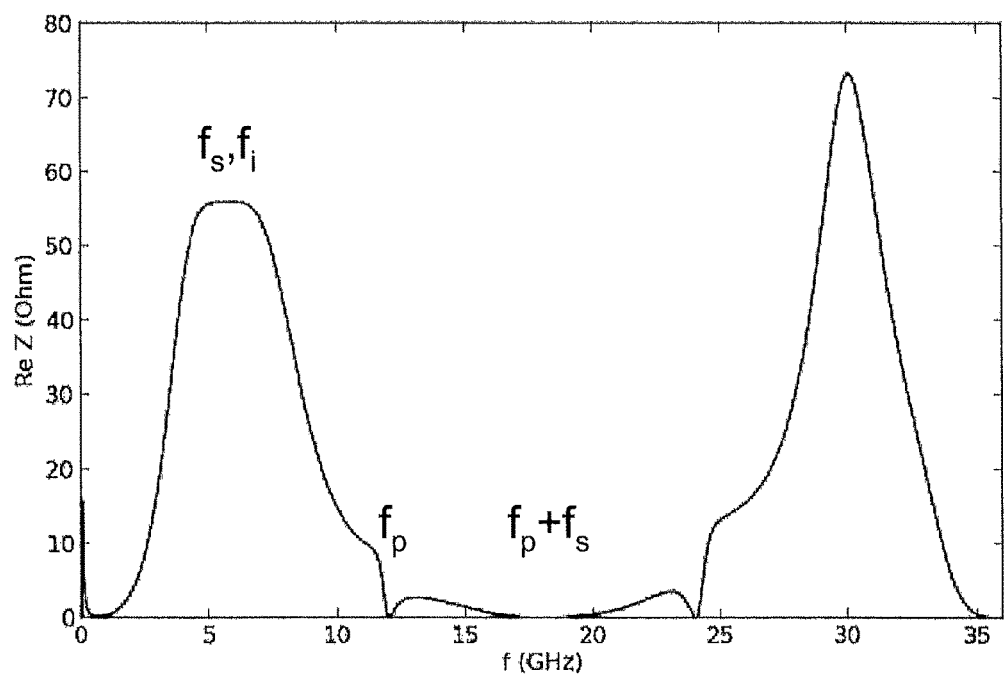
FIG. 7 shows a graph presenting the real part of the impedance as a function of the frequency of a matching circuit according to a second embodiment of a first aspect of the invention.

The amplitude of the real part of the impedance as a function of the frequency obtained with this exemplary embodiment is illustrated in FIG. 7. As previously, the impedance indeed has a high impedance (thus non zero) at the frequencies $f_s$ and $f_i$. More particularly, the impedance has a high impedance plateau several GHz wide around the signal $f_s$ and idler $f_i$ frequencies. In other words, an amplifier comprising such a circuit will have a wide frequency band around the signal frequency $f_s$ in which the signal will be amplified. In the same way, the impedance is substantially equal to zero for the frequencies $f_p$ and $f_p+f_s$ as well as at low frequencies. The impedance obtained with this structure thus meets the previously established criteria, namely a noise less than 1 photon and makes it possible moreover to separate the DC part of the circuit from the AC part.

Figure 8:
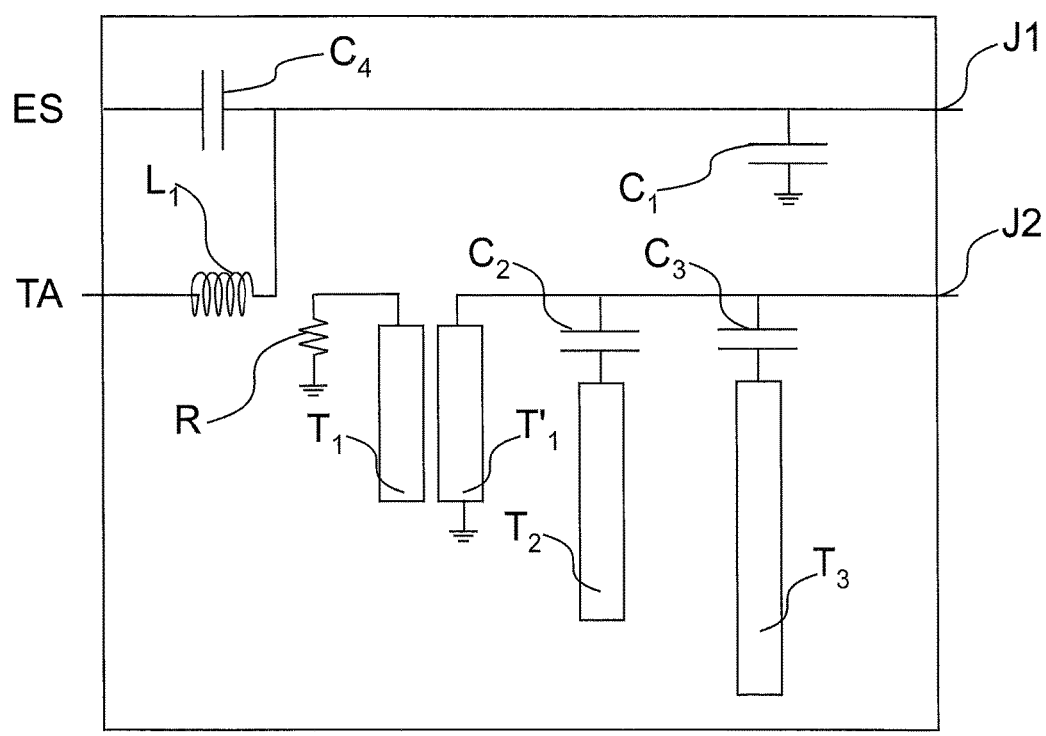
FIG. 8 shows a matching circuit according to a third embodiment of a first aspect of the invention.

A third embodiment of a matching circuit according to a first aspect of the invention is illustrated in FIG. 8. In this embodiment, the first connection port J1 is connected to the input/output terminal ES through a fourth capacitance $C_4$. The first connection port J1 is also connected to earth through a first capacitance $C_1$ and to the supply terminal TA through an inductance $L_1$. The circuit also comprises a first waveguide segment $T_1$ of which a first end is connected to an infinite impedance (that is to say an open circuit) and of which a second end is connected to earth through a resistance R. The circuit also comprises a second waveguide segment $T_2$ of which a first end is at an infinite impedance (that is to say an open circuit) and of which a second end is connected to the second connection port J2 through a second capacitance $C_2$. The circuit further comprises a third waveguide segment $T_3$ of which one end is connected to an infinite impedance (that is to say to an open circuit) and of which a second end is connected to the second connection port J2 through a third capacitance $C_3$. The circuit also comprises a fourth waveguide segment $T'_1$ of which a first end is connected to earth and of which a second end is connected to the second connection port J2. In addition, the first waveguide segment $T_1$ is coupled in a capacitive manner to the fourth waveguide $T'_1$.

In an exemplary embodiment, $f_p=300$ GHz, $f_i=290$ GHz and $f_s=10$ GHz are chosen. In this exemplary embodiment, the first waveguide segment $T_1$ and the fourth waveguide segment $T'_1$ have a length $$l = \frac{\lambda_1}{4}$$

with $\lambda_1$ the wavelength associated with the frequency $f_1=310$ GHz, an even impedance $Z_{1P}$ equal to 25Ω and an uneven impedance $Z_{1I}$ equal to 20Ω (these two impedances are due to coupling between the first waveguide segment and the fourth waveguide segment).

The second waveguide segment $T_2$ has a length $$l = \frac{\lambda_2}{2}$$

with $\lambda_2$ the wavelength associated with the frequency $f_2=320$ GHz and an impedance $Z_2$ equal to 50Ω. In addition, the second capacitance $C_2$ has an impedance of 1 fF. Thus the association of the second waveguide segment $T_2$ and the second capacitance $C_2$ makes it possible to obtain an antiresonance at $f_p+f_s$ (that is to say 310 GHz).

The third waveguide segment $T_3$ has a length $$l = \frac{\lambda_3}{2}$$

with $\lambda_3$ the wavelength associated with the frequency $f_3=304.6$ GHz and an impedance $Z_3$ equal to 50Ω. In addition, the third capacitance $C_3$ has an impedance of 0.5 fF. Thus the association of the third waveguide segment $T_3$ and the third capacitance $C_3$ makes it possible to obtain an antiresonance at $f_p$ (that is to say 300 GHz).

Figure 9:
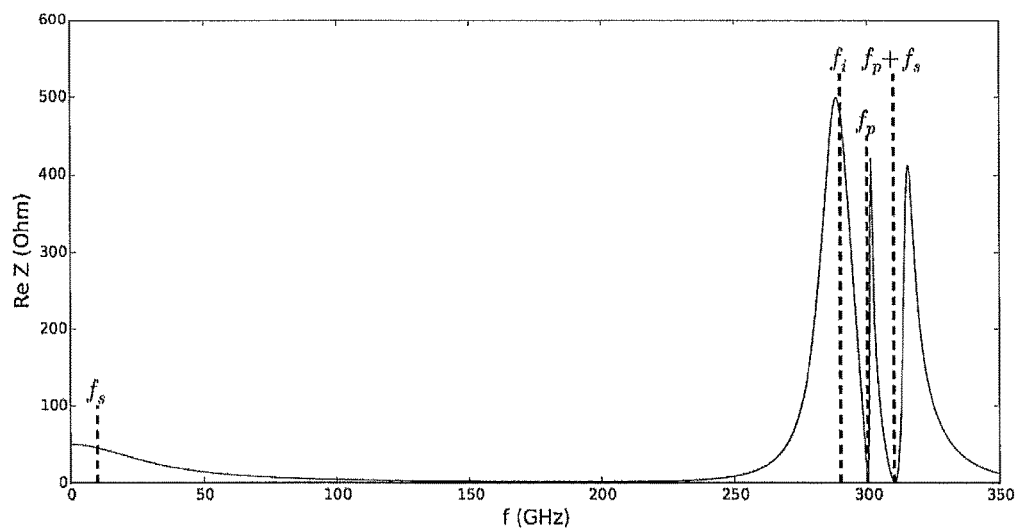
FIG. 9 shows a graph presenting the real part of the impedance as a function of the frequency of a matching circuit according to a third embodiment of a first aspect of the invention.

Moreover, the first capacitance $C_1$ has an impedance of 100 fF, the fourth capacitance $C_4$ has an impedance of 100 pF, the inductance $L_1$ has an impedance of 100 nH and the resistance R has an impedance of 5Ω. In this exemplary embodiment, the fourth capacitance $C_4$ and the inductance $L_1$ make it possible to control the low cut-off frequency (around 80 MHz). It is also possible to choose impedance values for these elements one hundred times lower to centre the pass band around 10 GHz. The amplitude of the real part of the impedance as a function of the frequency obtained with this exemplary embodiment is illustrated in FIG. 9.

Figure 10:
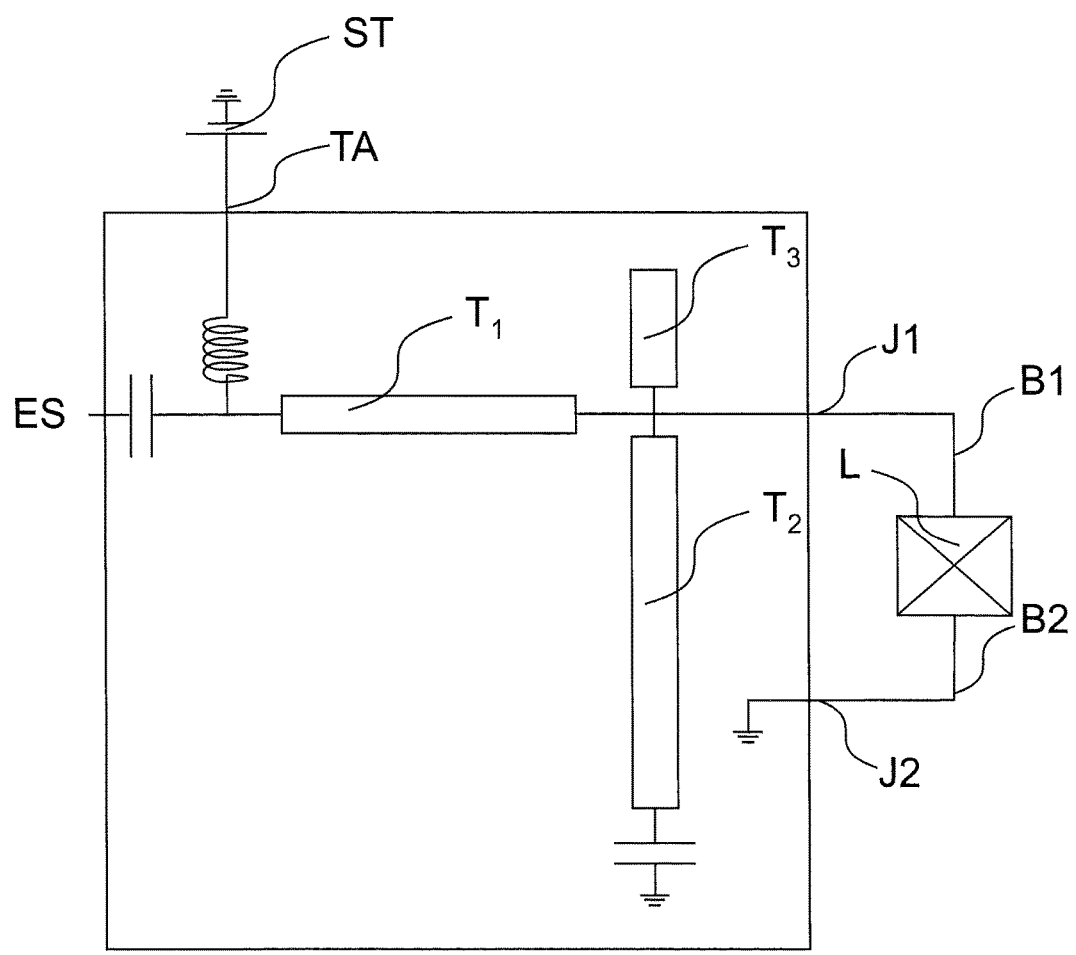
FIG. 10 shows an amplifier with Josephson junction according to an embodiment of a second aspect of the invention.

The three preceding embodiments demonstrate through four examples how to obtain a matching circuit having the necessary characteristics to obtain a low noise amplifier. It is thus possible, from a matching circuit according to a first aspect of the invention, to produce a low noise amplifier. Such an amplifier is illustrated in FIG. 10.

This amplifier comprises a non-linear impedance in the form of a Josephson junction L. The superconductor material of the junction is chosen such that $$f_s < \frac{2\Delta}{h}$$

with $\Delta$ the superconductor gap of the superconductor material. In order to voltage polarise the impedance of the junction, the amplifier also comprises a polarisation source, here in the form of a voltage source ST. The latter is connected by means of the T connection so as to apply a voltage V to the connectors of the Josephson junction L. The presence of this T connection makes it possible to ensure that the high frequency signals come from or are sent to the input/output port ES whereas the low frequency signals come from or are sent to the supply terminal TA.

In an exemplary embodiment, a matching circuit is chosen according to the first exemplary embodiment, in other words, $f_p$=12 GHz and $f_s$=$f_i$=6 GHz are chosen. The polarisation source is configured to apply a voltage $$V = 12 \text{ GHz} \times \frac{h}{2e}$$

in order to supply the energy necessary to the Cooper pairs of the junction to generate photons at the signal frequency $f_s$ and at the idler frequency $f_i$. For these frequencies, the material may be chosen from all superconductors such as for example aluminium. For higher frequencies (several hundreds of GHz), it will be beneficial to choose for example niobium nitride which has a superconductor gap better suited to these high frequencies.

In this exemplary embodiment, the non-linear impedance is constituted of a Josephson junction. The use of a Josephson junction provides a benefit in terms of manufacture, such a junction being easy to obtain. On the other hand, when a large number of devices are manufactured, it may be difficult to have good homogeneity in the properties of the different Josephson junctions notably in terms of critical current. Yet, in the amplifier according to an embodiment of the invention, the gain is directly dependent on the critical current. In other words, when a Josephson junction is used as non-linear impedance, the amplification gain can vary from one amplifier to the next.

In order to overcome this drawback, in a second embodiment of a second aspect of the invention, a SQUID (Superconducting Quantum Interference Device) is thus beneficially used. As a reminder, a SQUID comes in the form of a superconducting loop comprising two Josephson Junctions. The critical current of such a structure may be modulated by varying the magnetic flux going through the loop by means of a magnetic field. It is thus possible to adjust in-situ the critical current of the SQUID and thus the gain of the amplifier using such a SQUID. A magnetic field may for example be applied by means of an electric line close to the SQUID and in which a current flows.

The invention claimed is:

1. An impedance matching circuit intended to be connected to a non-linear impedance comprising a superconductor, said circuit comprising:
   a first terminal designated first connection port configured to be connected to a first connector of the non-linear impedance;
   a second terminal designated second connection port configured to be connected to a second connector of the non-linear impedance;
   a third terminal designated input/output terminal configured to receive a signal to amplify with a gain in power G and a pass band BW;
   a fourth terminal designated supply terminal configured to be connected to a polarisation source and configured so that a voltage V is applied between the first connection port and the second connection port, and
   a plurality of passive electrical components configured such that the impedance Z(f) between the first connection port and the second connection port for a signal of frequency f has a real part Re(Z(f)) such that:
   $Re(Z(f_s))>0$ with $f_s$ a first frequency designated frequency of the signal;
   $Re(Z(f_i))>0$ with $f_i$ a second frequency designated idler frequency;

$$Re(Z(0)) < \frac{h}{4e^2} \frac{f_p}{G \cdot BW}$$

with $f_p$ a third frequency designated pump frequency;

$$Re(Z(f_p + f_s)) < \frac{f_p + f_s}{f_i} Re(Z(f_i));$$

the pump frequency being chosen such that $nf_p$=$f_s$+$f_i$ with n an integer belonging to [1, +∞] and the idler frequency being chosen such that $$f_i > \frac{k_B T}{h}$$

with T the temperature of the circuit, $k_B$ Boltzmann's constant and h Planck's constant.

2. The circuit according to claim 1, wherein $$Re(Z(f_p + f_s)) < \frac{Re(Z(f_i))}{10}.$$

3. The circuit according to claim 1, wherein $$Re(Z(0)) < \frac{h}{4e^2} \frac{1}{10G}.$$

4. The circuit according to claim 1, wherein $$Re(Z(f_p)) < \frac{4e^2}{h} BW \frac{f_p}{f_s \cdot f_i} Re(Z(f_s))Re(Z(f_i)).$$

5. The circuit according to claim 1, wherein the input/output terminal is intended to be connected to an impedance of value $Z_0$ and $$\text{Re}(Z(f_s)) < 2\frac{|Z_{trans}(f_s)|^2}{Z_0}$$

with $Z_{trans}(f_s)$ the voltage at the level of the input/output terminal when a unit current of frequency $f_s$ is applied between the first connection port and the second connection port.

6. The circuit according to claim 1, wherein $$\text{Re}(Z(f_p + f_s)) < \frac{f_p + f_i}{f_s}\text{Re}(Z(f_s)).$$

7. The circuit according to claim 1, wherein $$f_i > 4\frac{k_B T}{h}.$$

8. The circuit according to claim 1, wherein n=1.
9. The circuit according to claim 1, wherein $$\max\{\text{Re}(Z(f_s)), \text{Re}(Z(f_i))\} < \frac{h}{4e^2}.$$

10. The circuit according to claim 1, wherein the plurality of passive electrical components comprises:
- a first waveguide segment of which a first end is connected to the supply terminal through an inductance and to the input/output terminal through a first capacitance and a second end is connected to the first connection port;
- a second waveguide segment of which a first end is connected to earth through a second capacitance and a second end is connected to the first connection port;
- a third waveguide segment of which a first end is connected to an infinite impedance and a second end is connected to the first connection port;

and wherein the second connection port is connected to earth.

11. A reflection amplifier comprising an impedance matching circuit according to claim 1, a polarisation source connected to the supply terminal, a non-linear impedance comprising a superconductor, said non-linear impedance comprising a first connector and a second connector, the first connector of the impedance being connected to the first connection port of the matching circuit, the second connector of the impedance being connected to the second connection port of the matching circuit, wherein the voltage applied between the first connection terminal and the second connection terminal by means of the voltage source is chosen such that $$f_p = \frac{2eV}{h}$$

with 2e the electric charge of a Cooper pair and h Planck's constant.

12. The amplifier according to claim 11, wherein the superconductor material of the non-linear impedance is chosen such that $$f_s < \frac{2\Delta}{h}$$

with $\Delta$ the superconductor gap of the superconductor.

13. The amplifier according to claim 11, wherein the non-linear impedance comprises a Josephson junction.
14. The amplifier according to claim 13, wherein the Josephson junction is of Superconductor/Insulator/Superconductor type.
15. The amplifier according to claim 11, wherein the non-linear superconducting impedance comprises a SQUID.

* * * * *